(12) United States Patent
Murata

(10) Patent No.: US 8,179,022 B2
(45) Date of Patent: May 15, 2012

(54) PIEZOELECTRIC DEVICE WITH IMPROVED SEPARATION BETWEEN INPUT-OUTPUT TERMINALS AND EXTERNAL CONNECTING TERMINALS

(75) Inventor: Kazuo Murata, Saitama (JP)

(73) Assignee: Citizen Finetech Miyota Co., Ltd., Kitasaku-gun, Nagano (JP)

( * ) Notice: Subject to any disclaimer, the term of this patent is extended or adjusted under 35 U.S.C. 154(b) by 398 days.

(21) Appl. No.: 12/443,603

(22) PCT Filed: Sep. 28, 2007

(86) PCT No.: PCT/JP2007/068972
§ 371 (c)(1),
(2), (4) Date: Mar. 30, 2009

(87) PCT Pub. No.: WO2008/038767
PCT Pub. Date: Apr. 3, 2008

(65) Prior Publication Data
US 2010/0102671 A1      Apr. 29, 2010

(30) Foreign Application Priority Data

Sep. 30, 2006 (JP) ................................ 2006-270162

(51) Int. Cl.
*H03H 9/25* (2006.01)
*H01L 41/08* (2006.01)
(52) U.S. Cl. .......................... 310/348; 310/344; 310/365
(58) Field of Classification Search .................. 310/344, 310/348, 365
See application file for complete search history.

(56) References Cited

U.S. PATENT DOCUMENTS

| 5,612,512 A | * | 3/1997 | Wakamatsu et al. | .......... 174/260 |
| 5,635,672 A | * | 6/1997 | Kawaura | ...................... 174/564 |
| 5,821,665 A | * | 10/1998 | Onishi et al. | ............ 310/313 R |
| 7,098,580 B2 | * | 8/2006 | Sasagawa et al. | ............ 310/348 |

(Continued)

FOREIGN PATENT DOCUMENTS

JP          08107328 A  *  4/1996

(Continued)

OTHER PUBLICATIONS

International Search Report of PCT/JP2007/068972, Mailing Date of Nov. 13, 2007.

(Continued)

*Primary Examiner* — Jaydi San Martin
(74) *Attorney, Agent, or Firm* — Westerman, Hattori, Daniels & Adrian, LLP

(57) ABSTRACT

A piezoelectric device, having a piezoelectric vibrating piece and a circuit element being electrically connected, is provided with a package for storing inside at least the piezoelectric vibrating piece of the piezoelectric device. The package is made up of a substrate and a cover body, and on the outer surface of the package, an electrode terminal electrically connected to at least the circuit element or the piezoelectric vibrating piece is provided. The electrode terminal includes an external connecting terminal which is electrically connected with an external circuit board and an input-output terminal which is electrically non-connected with the external circuit board, at the time of mounting the package on the external circuit board. The surface of the external connecting terminal and that of the input-output terminal are formed of materials different from each other so that adhesive characteristics to a mounting material such as a solder are varied.

18 Claims, 9 Drawing Sheets

U.S. PATENT DOCUMENTS

| | | | |
|---|---|---|---|
| 7,123,107 B2 * | 10/2006 | Koyama et al. | 331/68 |
| 7,449,820 B2 * | 11/2008 | Moriya | 310/348 |
| 7,456,552 B2 * | 11/2008 | Chiba et al. | 310/348 |
| 7,489,208 B2 * | 2/2009 | Moriya | 331/158 |
| 2004/0217670 A1 | 11/2004 | Ueda et al. | |
| 2009/0127696 A1 * | 5/2009 | Matsumoto | 257/698 |

FOREIGN PATENT DOCUMENTS

| | | |
|---|---|---|
| JP | 2000-196360 A | 7/2000 |
| JP | 2001-102869 A | 4/2001 |
| JP | 2001-320240 A | 11/2001 |
| JP | 2002-190710 A | 7/2002 |
| JP | 2003-198310 A | 7/2003 |
| JP | 2004-72381 A | 3/2004 |
| JP | 2004-072381 A | 3/2004 |
| JP | 2004-312474 A | 11/2004 |
| JP | 2005-253007 A | 9/2005 |
| JP | 2006-013435 A | 1/2006 |
| JP | 2006-13435 A | 1/2006 |
| JP | 2006-086453 A | 3/2006 |
| JP | 2006-86453 A | 3/2006 |
| JP | 2006-101242 A | 3/2006 |

OTHER PUBLICATIONS

Notification of Transmittal of Translation of the International Preliminary Report on Patentability (Form PCT/IB/338) of International Application No. PCT/JP2007/068972 mailed Apr. 30, 2009 with Forms PCT/IB/373 and PCT/ISA/237.

Notification of Reasons for Refusal dated Apr. 12, 2011, issued in corresponding Japanese Patent Application No. .2008-536444.

* cited by examiner

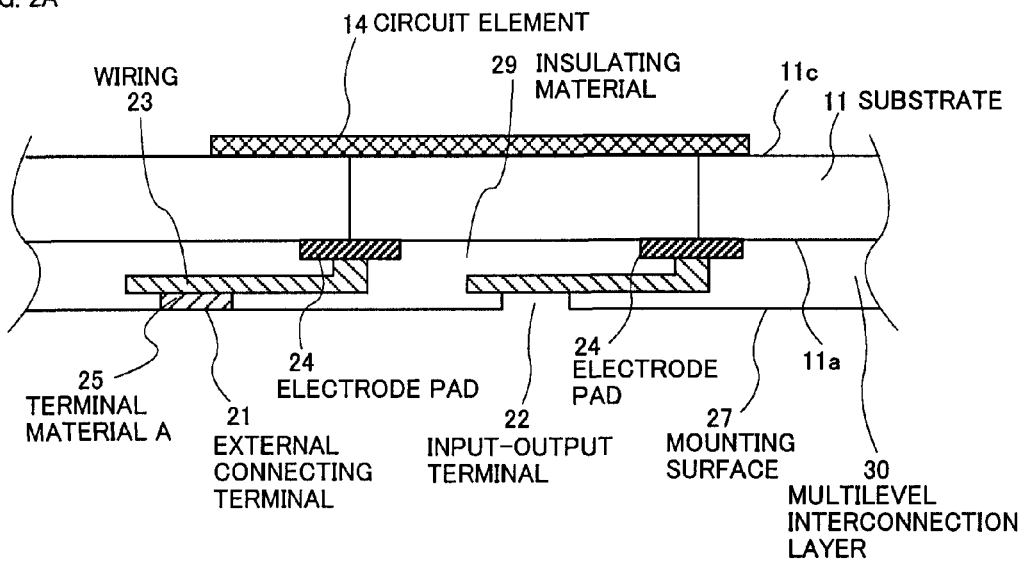
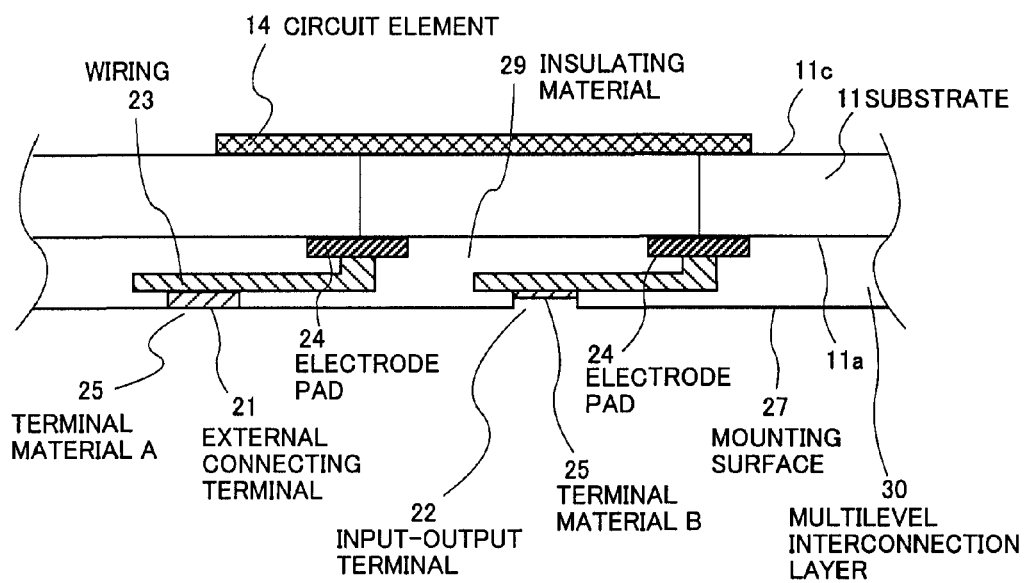

PIEZOELECTRIC DEVICE WITH IMPROVED SEPARATION BETWEEN INPUT-OUTPUT TERMINALS AND EXTERNAL CONNECTING TERMINALS

TECHNICAL FIELD

The present invention relates to a piezoelectric device.

BACKGROUND ART

In recent years, along with advancement of portable appliances and the like, demands are increasing for a highly stable and highly precise piezoelectric device that is used in such appliances. As a configuration for achieving the highly stable and highly precise piezoelectric device, a combination of a piezoelectric vibrator and a circuit element is now coming into use.

By way of example, the patent document 1 discloses a piezoelectric device which is highly stable and highly precise. FIG. 9 illustrates a structure of such conventional piezoelectric device.

In FIG. 9, an external connecting terminal 101 and an input-output terminal 102 are mounted on the underside 107 of a package 103 of the piezoelectric device 100. The external connecting terminal 101 and the input-output terminal 102 are terminals for inputting control data into a circuit element (not illustrated), for achieving highly stable and highly precise characteristics of the piezoelectric device 100. Electrical signals of the control data are inputted into the circuit element (not illustrated) via the external connecting terminal 101 and the input-output terminal 102.

The piezoelectric device 100 operates based on the control data being inputted. The external connecting terminal 101 and the input-output terminal 102 output externally, characteristic data that is obtained according to the operation of the piezoelectric device 100. The characteristic data externally outputted can be utilized for a characteristic inspection of the piezoelectric device 100.

The input-output terminal 102 is a terminal provided specifically for inputting of the control data into the circuit element provided in the piezoelectric device 100, or outputting the characteristic data of the piezoelectric device 100. On the other hand, the external connecting terminal 101 is a terminal that is used when the piezoelectric device 100 is in driving operation. The external connecting terminal 101 is a terminal to be electrically connected with an external circuit board (not illustrated) when the piezoelectric device 100 is mounted on the external circuit board (not illustrated). The external connecting terminal 101 is used to input the control data and output the characteristic data, as performed for the piezoelectric device 100, and in addition, it is also used for supplying electric power into the piezoelectric device 100, and performing oscillation output.

After executing the input of control data into the circuit element of the piezoelectric device 100, the characteristic inspection of the piezoelectric device 100, and the like, the external connection terminal 101 is used as a power voltage supplying terminal for supplying power voltage into the piezoelectric device and as an oscillation output terminal for taking out the oscillation output from the piezoelectric device. On the other hand, the input-output terminal 102 is a dedicated terminal for inputting the control data or outputting the characteristic data, and it becomes unnecessary after the installation on the external circuit board.

The surface of the external connecting terminal 101 and the surface of the input-output terminal 102 of the piezoelectric device 100 are gold-plated, which is solder wettable, in general.

[Patent Document 1]
Japanese Unexamined Patent Application Publication No. 2001-102869

DISCLOSURE OF THE INVENTION

Problem to be Solved by the Invention

The piezoelectric device configured as described above incorporates the input-output terminal and the external connection terminal in a package.

After being manufactured, the piezoelectric device is mounted on the external circuit board, and then it becomes ready for usage. Adjustment and characteristic inspection of the piezoelectric device are performed before the piezoelectric device is mounted on the external circuit board, and mounting on the external circuit board is carried out after the completion of the adjustment and the characteristic inspection.

In the adjustment and the characteristic inspection, control data for achieving highly stable and highly precise characteristics of the piezoelectric device is inputted via the input-output terminal and the external connection terminal, and in addition, the characteristic data of the piezoelectric device is outputted via those terminals, in the state before the package is mounted on the external circuit board.

On the other hand, after the package is mounted on the external circuit board and completed as a product, only the external connection terminal is used for supplying electric power voltage to the piezoelectric device and taking out oscillation output from the piezoelectric device, whereas the input-output terminal is not used.

Therefore, the input-output terminal becomes unnecessary for the piezoelectric device from a practical standpoint, once the product is completed. Eventually, this input-output terminal remains as a part of the product, in the state of being exposed on the package surface of the piezoelectric device.

In addition, the piezoelectric device of recent years is required to have a downsized package, in response to growing demands for downsized piezoelectric device. Therefore, the underside area of the package for installing the terminals is made smaller, and accordingly, a distance between the input-output terminal and the external connecting terminal is becoming extremely short.

Under those circumstances, when the piezoelectric device is mounted on the external circuit board, and the external connecting terminal of the piezoelectric device and the external circuit board are connected with each other electrically and mechanically, using a mounting material such as solder, there is a possibility that the solder may also adhere to the input-output terminal which is provided on the same surface of the package. This may establish a short circuit between the input-output terminal and the external connection terminal.

The input-output terminal is a terminal which becomes unnecessary after the product completion from a practical standpoint. However, short-circuit with the external connecting terminal is likely to have an adverse impact on the piezoelectric device. When short-circuit occurs between the input-output terminal and the external connection terminal, the circuit which activates the piezoelectric device may get into abnormal connecting state, rendering the circuit operation unstable. In addition, since unnecessary electrical signals get into the circuit element, there is a problem that the characteristics of the piezoelectric device may be deteriorated.

The short-circuit between the input-output terminal and the external connecting terminal is more likely to occur, in the case where the surface of the input-output terminal and the surface of the external connecting terminal are made of a material such as gold, which is solder wettable, and the distance between the input-output terminal and the external connection terminal is extremely short.

In view of the problems above, an object of the present invention is directed to preventing short-circuit between the input-output terminal and the external connecting terminal, when the piezoelectric device is mounted on the external circuit board by using a mounting material such as solder. In addition, the object of the present invention is also directed to providing a highly stable piezoelectric device which has a circuit operation being stabilized and which does not bring about any deterioration of characteristics, by preventing short-circuit between the input-output terminal and the external connecting terminal.

Means to Solve the Problem

The present invention is directed to a piezoelectric device having a piezoelectric vibrating piece and a circuit element being electrically connected with each other, wherein a package is provided for storing inside at least the piezoelectric vibrating piece of the piezoelectric device. The package is made up of a substrate and a cover body, and includes on an outer surface of the package, an electrode terminal that is electrically connected to at least either one of the circuit element and the piezoelectric vibrating piece. The electrode terminal includes an external connecting terminal which is connected electrically with an external circuit board, and an input-output terminal which is non-connected electrically with the external circuit board, when the package is mounted on the external circuit board.

The piezoelectric device according to the present invention includes the electrode terminal of the external connecting terminal and the input-output terminal, being provided on the outer surface of the package, and the surface of the external connecting terminal and the surface of the input-output terminal are made of materials being different respectively. The surfaces of respective terminals are made of different materials, thereby achieving different adhesive properties to a mounting material such as solder.

The surface of the external connecting terminal is made of a material with a good adhesiveness to the mounting material, thereby enhancing the adhesiveness between the external connecting terminal and an electrode on the external circuit board side. On the other hand, the surface of the input-output terminal is made of a material with a low adhesiveness to the mounting material, thereby reducing the adhesiveness between the input-output terminal and the electrode on the external circuit board side. Since the adhesiveness is lowered as such, it is possible to prevent the input-output terminal from establishing short-circuit with the external connecting terminal via the mounting material, even in the case where the mounting material adheres to the input-output terminal.

The piezoelectric device of the present invention includes the electrode terminal of the external connecting terminal and the input-output terminal, being provided on the outer surface of the package, and the surface of the external connecting terminal and the surface of the input-output terminal are formed to have a difference of elevation with respect to the surface of the package. The height from the surface of the package is made different between the external connecting terminal and the input-output terminal. With this difference of elevation between the external connecting terminal surface and the input-output terminal surface, it is possible to prevent the mounting material having adhered to the surface of the external connecting terminal, from adhering to the surface of the input-output terminal, thereby preventing short-circuit between the input-output terminal and the external connecting terminal.

The substrate may be made up of a semiconductor substrate, and a circuit pattern incorporating a circuit element is formed at least on either one of opposing two surfaces, the front side and the back side of this semiconductor substrate. The package is mounted on the external circuit board, by using either one of the front and back surfaces of the semiconductor substrate, as a mounting surface.

It is possible to configure in such a manner that the circuit element is formed on one surface of the substrate, serving as the mounting surface, and the piezoelectric vibrating piece is mounted on the other surface of the substrate. The piezoelectric vibrating piece and the circuit element are electrically connected via a through electrode which penetrates the substrate. On the circuit element, there is formed a multilevel interconnection layer including wiring electrically connected to the circuit element. The external connecting terminal and the input-output terminal are connected to the circuit element via predetermined wiring in the multilevel interconnection layer. With this configuration, it is possible to connect the external connecting terminal and the input-output terminal to the circuit element via the multilevel interconnection layer, further establishing connection with the piezoelectric vibrating piece via the through electrode.

Since the external connecting terminal and the input-output terminal, and the circuit element are placed on the substrate surface, the area of the mounting surface of the package can be used for arranging the external connecting terminal and the input-output terminal, thereby allowing a high degree of flexibility in designing of the external terminal and the input-output terminal. In addition, it is possible to obtain a smaller sized piezoelectric device.

An insulating layer is formed on the surface of predetermined wiring of the multilevel interconnection layer, except a certain part. This multilevel interconnection layer has a part not covered by the insulating layer, and the exposed surface of the wiring, not covered by the insulating layer, is used for the input-output terminal and the external connecting terminal.

The terminal surface of the input-output terminal and the terminal surface of the external connecting terminal are configured in such a manner as having a difference of elevation. With this difference of elevation given to the surface of the external connecting terminal and the terminal surface of the input-output terminal, a vertical distance between the terminal surface of the external connecting terminal and the package surface is made different from the vertical distance between the terminal surface of the input-output terminal and the package surface. On this occasion, the terminal surface of the input-output terminal is positioned closer to the circuit element, compared to the terminal surface of the external connecting terminal.

Since the vertical distance between the terminal surface of the external connecting terminal and the package surface is made different from the vertical distance between the terminal surface of the input-output terminal and the package surface, it is possible to prevent the mounting material having adhered to the surface of the external connecting terminal, from adhering to the surface of the input-output terminal, thereby preventing short-circuit between the input-output terminal and the external connecting terminal.

The substrate and the cover body are formed in such a manner that one has a plate-like shape, and the other has a concave shape with a space for storing the piezoelectric vibrating piece therein. A peripheral edge of the cover body having the concave shape is bonded to the surface of the substrate having a plate-like shape, or a peripheral edge of the substrate having a concave shape is bonded to the surface of the cover body having a plate-like shape, thereby forming the package. Accordingly, the piezoelectric vibrating piece is encapsulated in the cavity of the package.

If adhesion of the piezoelectric vibrating piece to the substrate is performed by coating a conductive adhesive agent between the mount electrode that supports the piezoelectric vibrating piece and the substrate, this coating is performed by ejecting a certain amount of conductive adhesive agent to the mount electrode, through a coating nozzle. On this occasion, there is a problem that the coating nozzle may run into a wall part of the cavity of the package, making the coating of the conductive adhesive agent more difficult. In order to solve this problem, it can be considered to downsize the coating nozzle, but there is a limitation in downsizing, because it is necessary to supply stably a certain amount of conductive adhesive agent. In other words, downsizing of the piezoelectric device is also restricted.

On the other hand, in the present invention, the substrate is formed in a plate-like shape, thereby solving a disadvantage caused by the coating nozzle that may come into contact with the package wall.

Solder used for mounting is provided on the surface of the external connecting terminal, and by way of the solder, the package is mounted on the external circuit board, so that the external connecting terminal and the external circuit board are electrically connected.

The package of the piezoelectric device according to the present invention may be made of a material containing alumina as a major component.

The external connecting terminal of the piezoelectric device according to the present invention has the surface that may be made of at least one of the followings, as a major component; gold (Au), silver (Ag), platinum (Pt), palladium (Pd), rhodium (Rh), ruthenium (Ru), iridium (Ir), osmium (Os), and copper (Cu). On the other hand, the input-output terminal of the piezoelectric device according to the present invention has the surface that may be made of at least one of the followings, as a major component; aluminum (Al), titanium (Ti), chromium (Cr), and nickel (Ni).

The components of the external connecting terminal have a high adhesiveness to the mounting material such as solder, and the components of the input-output terminal have a low adhesiveness to the mounting material such as solder.

The input-output terminal serves as the electrode terminal for inputting control data into the circuit element, and further as the electrode terminal for outputting characteristic data from the piezoelectric device, in the state where the package is not mounted on the external circuit board.

Effect of the Invention

The piezoelectric device according to the present invention has the external connecting terminal whose outermost surface is made of a material being chemically stable and solder wettable, such as gold (Au) and silver (Ag), and the input-output terminal whose outermost surface is made of a material being chemically active, easily-oxidizable, and non solder wettable, such as Al, Ti, Ni, or Cr. With this configuration, when the piezoelectric device is mounted on the external circuit board by using a mounting material such as solder, the mounting material is prevented from adhering to the input-output terminal, and occurrence of short-circuit with the external connecting terminal can be avoided. Therefore, it is possible to prevent a malfunction of piezoelectric device, and provide a highly stable piezoelectric device that may not cause deterioration in characteristics.

In the piezoelectric device according to the present invention, a difference of elevation is provided between the surface of the input-output terminal and the surface of the external connecting terminal, and the surface of the input-output terminal is formed at a position lower than the mounting surface of the package. With this configuration, the distance between the input-output terminal surface and the external circuit board is longer than the distance between the external circuit board surface and the external connecting terminal, and therefore, adhesion of the mounting material such as solder to the input-output terminal can be prevented more effectively.

BRIEF DESCRIPTION OF DRAWINGS

FIG. 2 illustrates sectional views of the first embodiment of the present invention;

Figure 1A:
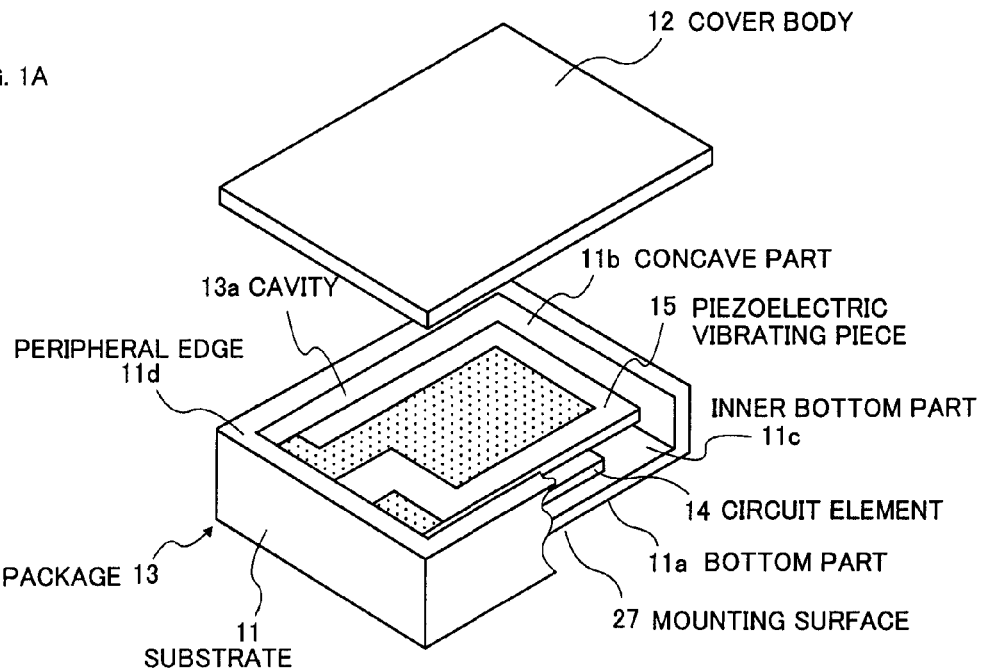
FIG. 1 illustrates perspective views of a structure of the piezoelectric device according to a first embodiment of the present invention.

DENOTATION OF REFERENCE NUMERALS 10, 10A, 10B, and 10C PIEZOELECTRIC DEVICE
11 SUBSTRATE
11A SEMICONDUCTOR SUBSTRATE
11a BOTTOM PART
11b CONCAVE PART
11c INNER BOTTOM PART
11d OPEN PERIPHERAL EDGE
12 COVER BODY
13 PACKAGE
13a CAVITY
14 CIRCUIT ELEMENT
15 PIEZOELECTRIC VIBRATING PIECE
15a EXCITATION ELECTRODE
15b CONNECTION ELECTRODE
16 MOUNT ELECTRODE
17 CONDUCTIVE ADHESIVE AGENT
18 THROUGH ELECTRODE
21 EXTERNAL CONNECTING TERMINAL
22 INPUT-OUTPUT TERMINAL
23 WIRING
24 ELECTRODE PAD
25 TERMINAL MATERIAL A 26 TERMINAL MATERIAL B
27 MOUNTING SURFACE
28 VIBRATING PIECE FIXING PART
29 INSULATING MATERIAL
30 MULTILEVEL INTERCONNECTION LAYER
100 PIEZOELECTRIC DEVICE
101 EXTERNAL CONNECTING TERMINAL
102 INPUT-OUTPUT TERMINAL
103 PACKAGE
107 MOUNTING SURFACE

BEST MODE FOR CARRYING OUT THE INVENTION

Preferred embodiments of the present invention will be described with reference to the accompanying drawings FIG. 1 to FIG. 8. Hereinafter, with reference to FIG. 1 and FIG. 2, the first embodiment will be explained, and with reference to FIG. 3 and FIG. 4, the second embodiment will be explained. FIG. 5 illustrates electrode terminals on the mounting surface of the piezoelectric device of the present invention, and the third embodiment will be explained with reference to FIG. 6 to FIG. 8.

The first embodiment and the second embodiment are examples to constitute a package by using a plate-like cover body and a concave substrate, and the third embodiment is an example to constitute the package by using a plate-like substrate and a concave cover body. The first embodiment is an example that a circuit element and the substrate are provided separately, and the second and the third embodiments are examples that the circuit element is provided within the substrate.

First Embodiment

Initially, the first embodiment of the piezoelectric device according to the present invention will be explained. The first embodiment is an example to constitute the package by using the plate-like cover body and the concave substrate, and the circuit element and the substrate are provided separately.

Figure 1B:
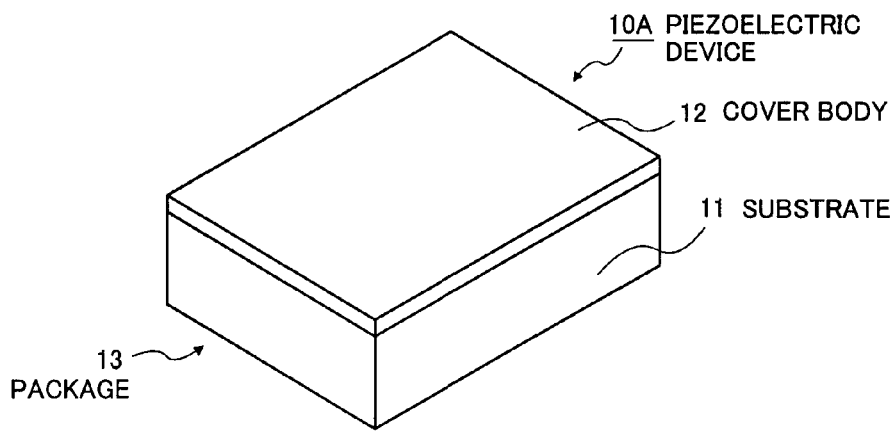
Figure 1C:
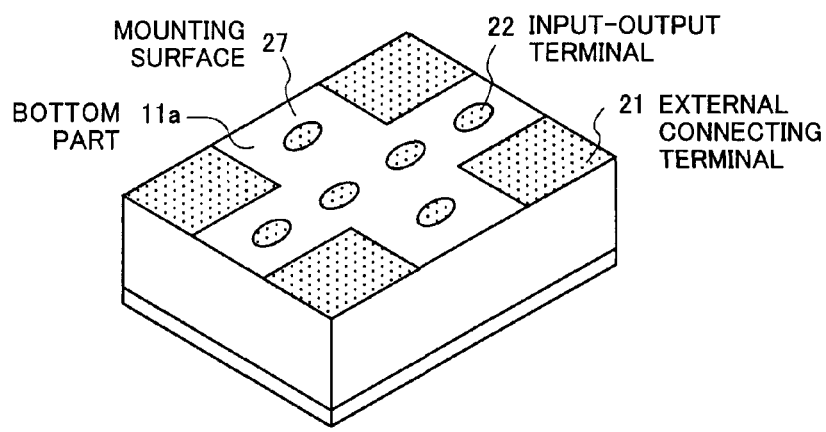

FIG. 1 illustrates perspective views of a structure of the piezoelectric device according to the first embodiment of the present invention. FIG. 1A is a perspective illustration to explain the configuration of the piezoelectric device of the present invention, FIG. 1B is a perspective illustration viewed from the top of the piezoelectric device of the present invention, and FIG. 1C is a perspective illustration viewed from the mounting surface of the piezoelectric device of the present invention. It is to be noted that FIG. 1B is a perspective illustration partially cutaway, to explain the configuration of the piezoelectric device of the present invention for the sake of easy understanding. FIG. 2 illustrates sectional views of the first embodiment of the present invention.

As shown in FIG. 1, the piezoelectric device 10A is provided with a package 13 having on a bottom part 11a, an external connecting terminal 21 and an input-output terminal 22 for inputting and outputting control data. This package 13 is made up of a substrate 11 and a cover body 12. The substrate 11 is provided with the bottom part 11a serving as a mounting surface 27 to be mounted on an external circuit board, a concave part 11b for storing inside a circuit element 14 and a piezoelectric vibrating piece 15, an inner bottom part 11c for supporting the circuit element 14 and the piezoelectric vibrating piece 15, and an open peripheral edge 11d for installing the cover body 12.

The circuit element 14 and the piezoelectric vibrating piece 15 are placed within the concave part 11b, and fixed mechanically to the substrate 11 and connected electrically therewith, by using a bump made of gold or solder, or an adhesive member such as conductive adhesive agent (not illustrated). The cover body 12 hermetically encapsulates the circuit element 14 and the piezoelectric vibrating piece 15 within the concave part 11b of the package 13.

The package 13 is made of a material containing silicon as a major component, or a material containing alumina as a major component.

It is to be noted that electrode pads (not illustrated) of the circuit element 14 are respectively connected to the external connecting terminal 21 and the input-output terminal 22 by wiring (not illustrated). By way of the external connecting terminal 21 and the input-output terminal 22, the circuit element 14 is allowed to input and output data, from and to the outside of the package 13, using electrical signals.

In the process of producing the piezoelectric device 10A, the external connecting terminal 21 and the input-output terminal 22 are used to input control data into the circuit element 14 to achieve highly stable and highly precise device characteristics of the piezoelectric device 10A, and output the device characteristics of the piezoelectric device 10A, which are obtained based on the control data being inputted into the circuit element 14.

The external connecting terminal 21 is utilized for connection and the like with the external circuit board even after the completion of the piezoelectric device 10A as a product. On the other hand, the input-output terminal 22 is a terminal which becomes unnecessary from a practical standpoint, after the input of the control data into the circuit element 14 and after execution of a characteristic inspection of the piezoelectric device 10A.

Here, it is assumed that this input-output terminal 22 is made of a material identical to the material of the external connecting terminal 21, and with this configuration, the input-output terminal 22 remains in the state being exposed on the mounting surface of the package 13. Under these circumstances, if the piezoelectric device 10A is mounted on the external circuit board or the like, by using solder or the like, solder may adhere even to the input-output terminal 22, and a short-circuit may occur between the external connecting terminal 21 and the input-output terminal 22. When such short-circuit occurs between the external connecting terminal 21 and the input-output terminal 22, the circuit element 14 falls into an abnormal connection state, disabling a function as a circuit to operate the piezoelectric device. Furthermore, unnecessary electrical signals may enter the circuit element, causing a characteristic deterioration of the piezoelectric device.

On the other hand, the piezoelectric device of the present invention has the external connecting terminal 21 whose surface is made of a material chemically stable and easily wettable by solder, and the input-output terminal 22 which is made of a material chemically active, easily oxidizable, and non-wettable by solder. With this configuration, the external connecting terminal 21 is connected electrically stably and fixed in such a manner as mechanically stable, and further, preventing the occurrence of short-circuit between the external connecting terminal 21 and the input-output terminal 22. Therefore, it is possible to provide a highly reliable piezoelectric device, which does not bring about malfunctioning, or the like.

Here, it is possible to configure the surface of the external connecting terminal 21 using at least one of the followings, as a major component; gold (Au), silver (Ag), platinum (Pt), palladium (Pd), rhodium (Rh), ruthenium (Ru), iridium (Ir), osmium (Os), and copper (Cu). On the other hand, it is possible to configure the surface of the input-output terminal using at least one of the followings, as a major component; aluminum (Al), titanium (Ti), chromium (Cr), and nickel (Ni).

It is to be noted that the external connecting terminal 21 and the input-output terminal 22 can be formed by using a method such as deposition including coating, printing, plating, sputtering, and evaporation, or a method such as aerosol deposition that sprays fine particles.

FIG. 1 illustrates the case where the piezoelectric vibrating piece 15 and the circuit element 14 are stored in an identical space within the package. However, it is also possible to configure such that the piezoelectric vibrating piece 15 and the circuit element 14 are respectively stored in different packages, and those are combined in the vertical direction or in the horizontal direction. Alternatively, it is possible to configure such that one package includes multiple spatial portions, and the piezoelectric vibrating piece 15 and the circuit element 14 are stored in the different spatial portions, respectively.

FIG. 2 illustrates sectional views for explaining an example of connection state between the electrode pad of the circuit element, and each of the external connecting terminal and the input-output terminal in the first embodiment of the present invention.

As shown in FIG. 2A and FIG. 2B, the circuit element 14 is provided on the inner bottom part 11c within the cavity side of the substrate 11, the multilevel interconnection layer 30 is provided on the bottom part 11a of the substrate 11, and the external connecting terminal 21 and the input-output terminal 22 are formed in the multilevel interconnection layer.

Wiring 23 and the electrode pads 24 are provided in the multilevel interconnection layer 30. The circuit element 14 and the electrode pads 24 are connected within the substrate 11. In the multilevel interconnection layer 30, the electrode pads are respectively connected to the wiring 23. The wiring 23 has a structure covered by an insulating material 29 for maintaining insulation with the circuit pattern of the circuit element 14. The insulating material 29 is removed at the parts where the external connecting terminal 21 and the input-output terminal 22 are formed, and the wiring 23 at those parts are exposed, allowing the structure to be conductive with the outside.

FIG. 2A illustrates the case where the wiring 23 is formed of a material being chemically active, such as aluminum (Al). The input-output terminal 22 is formed by utilizing the part where the insulating material 29 of the wiring 23 is removed, without any change. On the other hand, the external connecting terminal 21 is formed by laminating a terminal material A (25) made of a material chemically stable, such as gold (Au), on the part where the insulating material 29 of the wiring 23 is removed.

In other words, the surface of the external connecting terminal 21 is made of a material being chemically stable and easily wettable by solder, and the surface of the input-output terminal 22 is made of a material being chemically active, easily oxidizable, and non-wettable by solder. With this configuration, when the piezoelectric device is mounted on the external circuit board, the external connecting terminal 21 becomes stable electrically and mechanically, thereby suppressing occurrence of short-circuit between the external connecting terminal 21 and the input-output terminal 22. Therefore, it is possible to provide a highly reliable piezoelectric device that will not bring about malfunctioning, or the like.

FIG. 2B illustrates another structure where a terminal material B (26) that is a material being chemically active is further laminated on the part where the insulating material 29 of the wiring 23 is removed, so as to form the input-output terminal 22.

As for the configuration of the input-output terminal 22, FIG. 2A illustrates the structure where the wiring 23 is formed of a material being chemically active and non-wettable by solder, and FIG. 2B illustrates the structure where the terminal material B (26) being chemically active is laminated on the part where the insulating material 29 of the wiring 23 of the input-output terminal 22 is removed. If the configuration of FIG. 2B is employed, it is also possible to use a material being chemically stable, for the wiring 23.

Second Embodiment

Next, a second embodiment of the piezoelectric device according to the present invention will be explained.

Figure 3A:
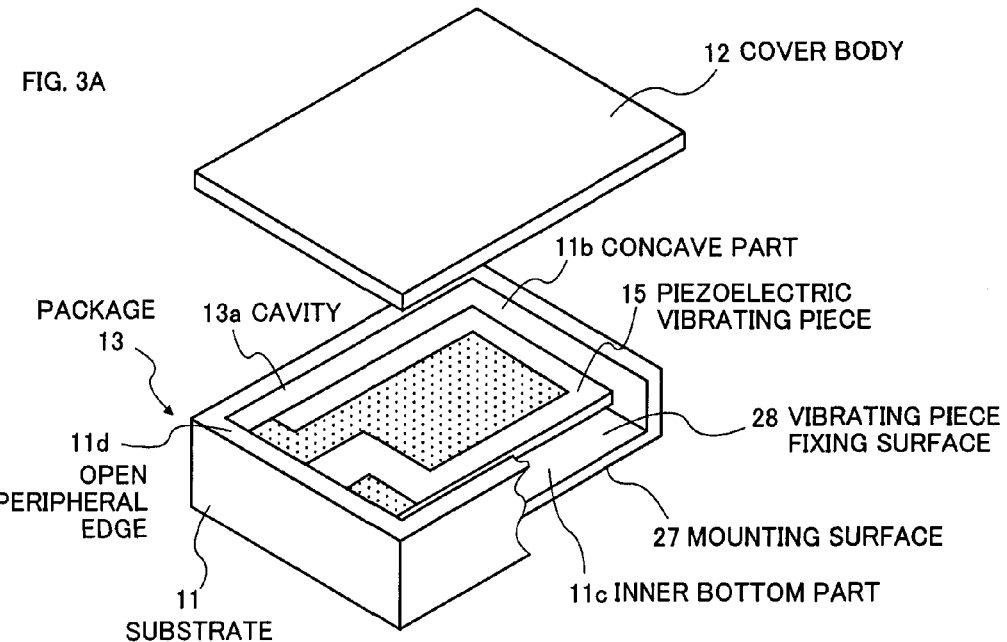
FIG. 3 illustrates perspective views of a structure of the piezoelectric device according to a second embodiment of the present invention.
Figure 3B:
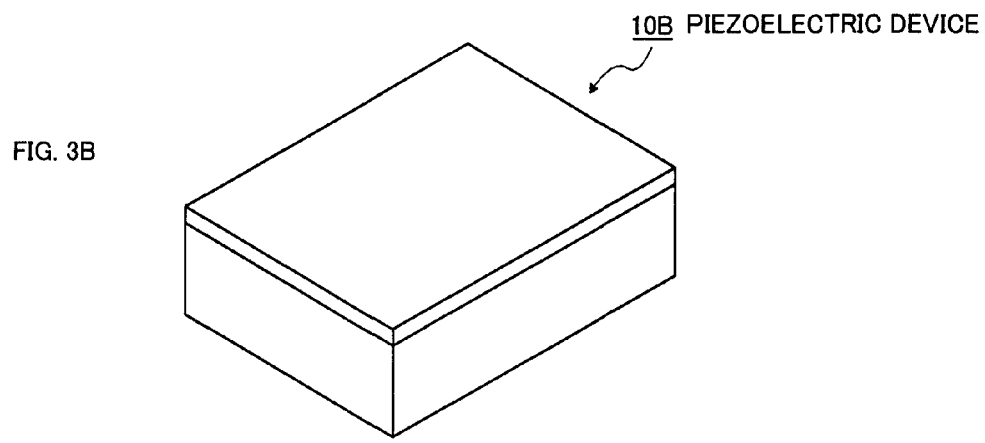
Figure 3C:
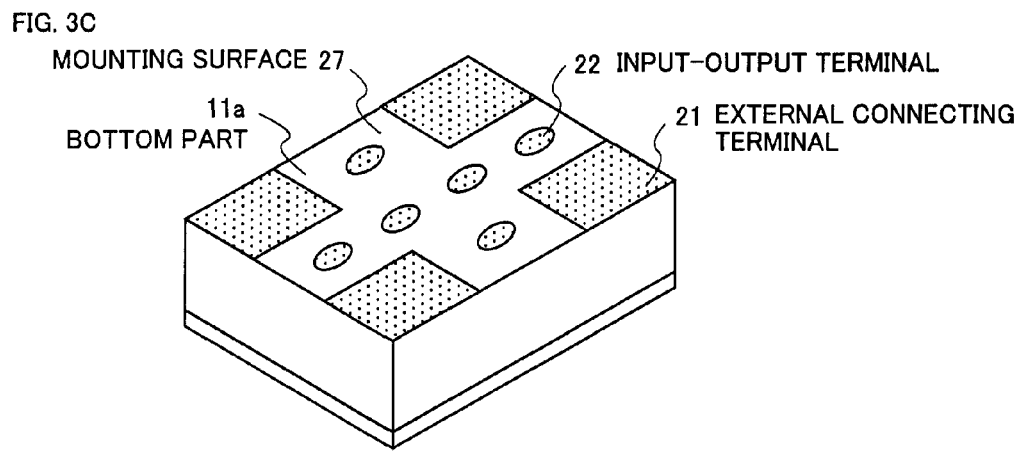

FIG. 3 illustrates perspective views of a structure of the piezoelectric device according to the second embodiment of the present invention. FIG. 3A is a perspective illustration to explain the configuration of the piezoelectric device of the present invention, FIG. 3B is a perspective illustration viewed from the top of the piezoelectric device of the present invention, and FIG. 3C is a perspective illustration viewed from the mounting surface of the piezoelectric device of the present invention. It is to be noted that FIG. 3A is a perspective illustration partially cutaway, to explain the configuration of the piezoelectric device of the present invention for the sake of easy understanding. FIG. 4 illustrates sectional views of the second embodiment of the present invention.

The first embodiment as shown in FIG. 1 and FIG. 2 is an example where the package and the circuit element exist separately. However, FIG. 3 illustrates an example of the piezoelectric device in which the circuit element may also function as the package 13, and the circuit element is formed within the substrate.

As shown in FIG. 3, the piezoelectric device 10B includes the external connecting terminal 21 and the input-output terminal 22 for inputting and outputting the control data, on the bottom part 11a. A circuit pattern (not illustrated) of the circuit element is formed in the substrate 11 of the package 13. The piezoelectric vibrating piece 15 is placed within the concave part 11b of the package 13, and fixed mechanically to the inner bottom part 11c of the package 13 and connected electrically therewith, by using a bump made of gold or solder, or an adhesive member such as conductive adhesive agent (not illustrated). A cover body 12 is installed on the open peripheral edge 11d of the substrate 11, and the cover body 12 hermetically encapsulates the piezoelectric vibrating piece 15 within the cavity 13a of the package 13.

The package 13 is made of a material containing silicon as a major component. The bottom part 11a of the package 13 serves as the mounting surface 27 to be mounted on the external circuit board. In addition, the inner bottom part 11c is a backside surface of the mounting surface 27, and serves as a vibrating piece fixing surface 28 for fixing the piezoelectric vibrating piece 15.

A semiconductor substrate 11A forms the substrate 11, and further a circuit pattern (not illustrated) of the circuit element 14 is formed therein.

Wiring (not illustrated) using a rewiring technique as shown in FIG. 3 connects the electrode pads (not illustrated) of the circuit element, with the input-output terminal 22 and the external connecting terminal 21, respectively.

FIG. 4 illustrates sectional views of the second embodiment of the present invention, showing one example of connection state between the electrode pad of the circuit element, and each of the external connecting terminal and the input-output terminal. Here, there is shown a case where the circuit pattern of the circuit element is formed in the mounting surface 27 of the semiconductor substrate 11A.

Figure 4A:
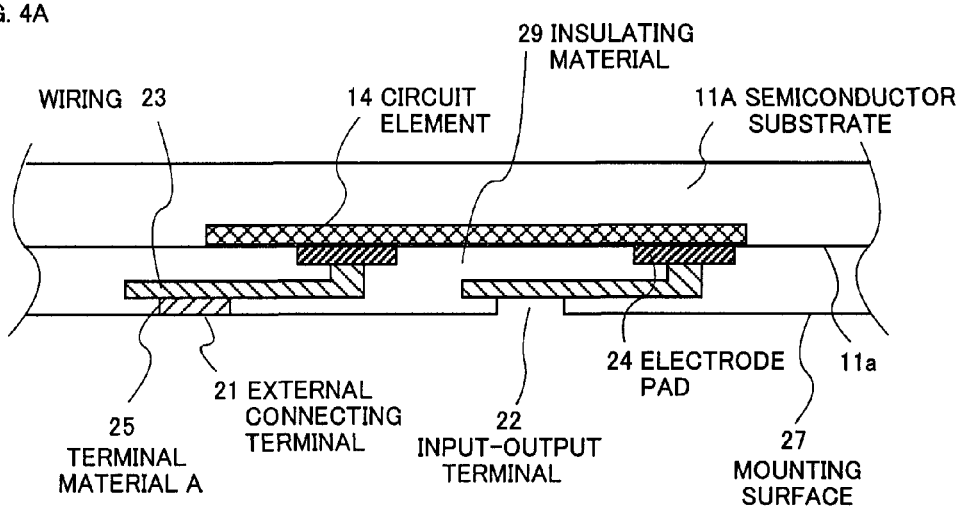
FIG. 4 illustrates sectional views of the second embodiment of the present invention.
Figure 5:
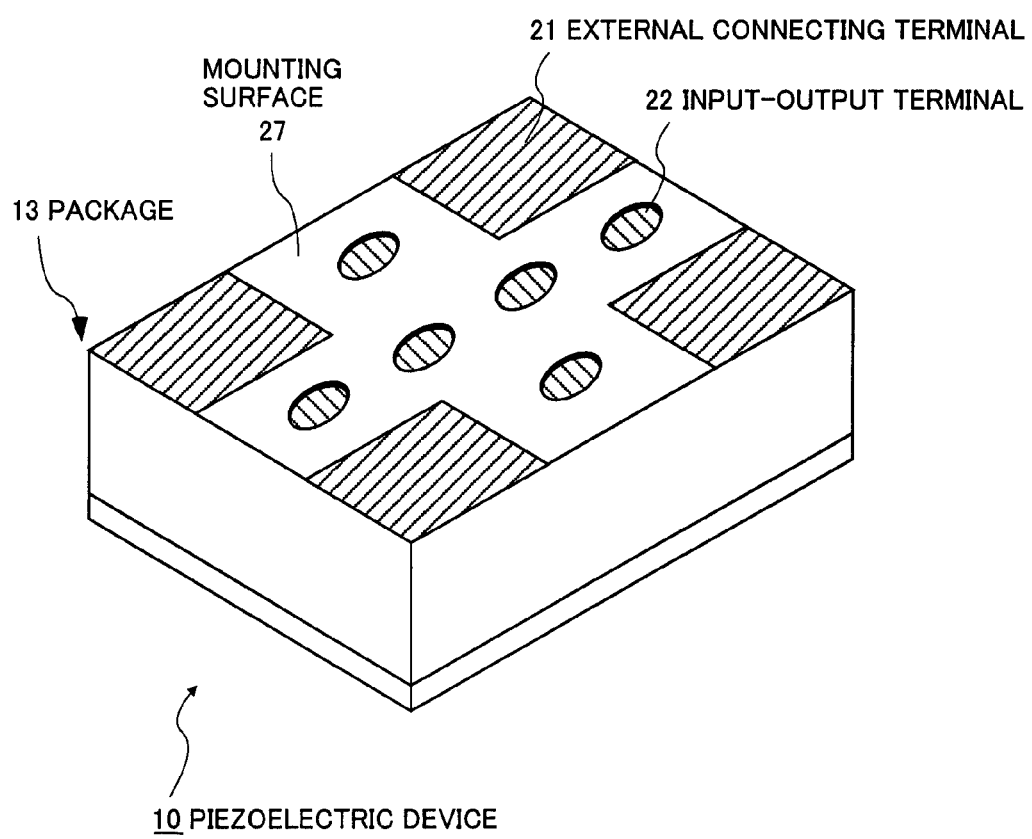
FIG. 5 is an illustration viewed from a mounting surface of the piezoelectric device according to the first and the second embodiments of the present invention.

As shown in FIG. 4A, each of the multiple electrode pads 24 held by the circuit element 14 is connected to the wiring 23. The wiring 23 is covered by the insulating material 29 to maintain insulation with the circuit pattern of the circuit element 14. The insulating material 29 at the parts relevant to the external connecting terminal 21 and the input-output terminal 22 are removed, and the wiring 23 at those parts are exposed, allowing the structure to be conductive with the outside.

FIG. 4A illustrates the case where the wiring 23 is made of a material being chemically active, such as aluminum (Al). The input-output terminal 22 is formed by utilizing the part where the insulating material 29 of the wiring 23 is removed, without any change. On the other hand, the external connecting terminal 21 is formed by laminating a terminal material A (25) made of chemically stable material such as gold (Au) on the part where the insulating material 29 of the wiring 23 is removed.

The surface of the external connecting terminal 21 is made of a material chemically stable and easily wettable by solder. On the other hand, the surface of the input-output terminal 22 is chemically active, easily oxidizable, and non-wettable by solder. With this configuration, the external connecting terminal 21 is connected and fixed in such a manner as electrically and mechanically stable. In addition, short-circuit between the external connecting terminal 21 and the input-output terminal 22 may not occur, and therefore, it is possible to provide a highly reliable piezoelectric device, which does not bring about malfunctioning, or the like.

Figure 4B:
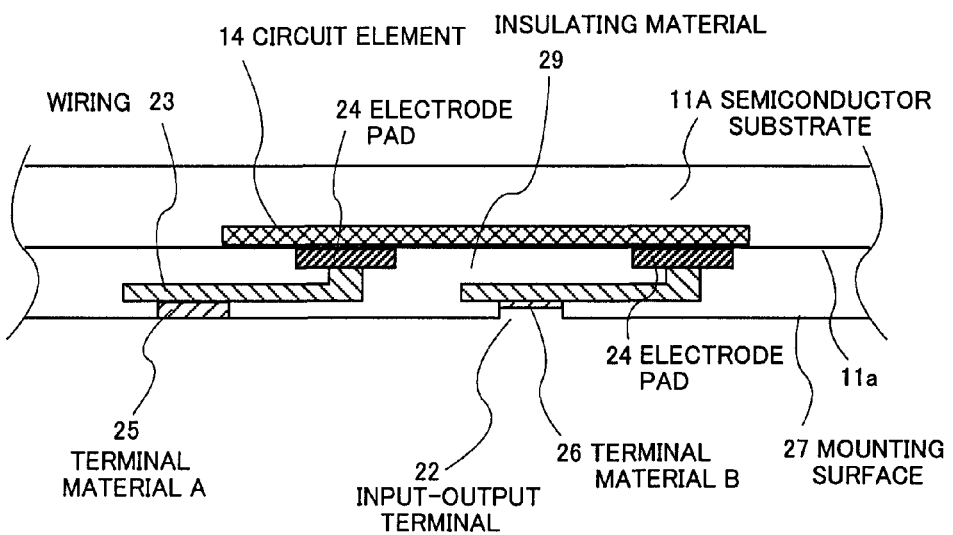

As shown in FIG. 4B, another structure is possible where a terminal material B (26) that is a material being chemically active is further laminated on the part where the insulating material 29 of the wiring 23 is removed, and the input-output terminal 22 is formed therein.

FIG. 4A illustrates the case where the wiring 23 is made of a material being chemically active and non-wettable by solder. However, FIG. 4B illustrates a structure where the terminal material B (26) being chemically active is laminated on the part where the insulating material 29 of the wiring 23 of the input-output terminal 22 is removed, so as to form the input-output terminal 22. Accordingly, it is possible to employ a material being chemically stable for the wiring 23.

FIG. 5 is a perspective view of the piezoelectric device according to the first and the second embodiments of the present invention, viewed from the mounting surface.

In FIG. 5, the external connecting terminal 21 and the input-output terminal 22 are provided on the mounting surface 27 of the package 13. In the state where the mounting surface 27 is facing upward, the surface of the input-output terminal 22 is formed at a position lower than the surface of the external connecting terminal 21.

As shown in FIG. 5, the surface of the input-output terminal 22 is formed at a position lower than the surface of the external connecting terminal 21. Accordingly, when the piezoelectric device 10B is mounted on the external circuit board (not illustrated) by a mounting material such as solder, the distance between the surface of the input-output terminal 22 and the external circuit board (not illustrated) is longer than the distance between the surface of the external connecting terminal 21 and the external circuit board (not illustrated). With this positional relationship, it is possible to effectively prevent the mounting material such as solder adhered to the external connecting terminal 21, from adhering to the input-output terminal 22.

FIG. 5 illustrates that the surface of the input-output terminal 22 is at a recessed position with respect to the surface of the external connecting terminal 21, but the configuration is not limited to this example. It is needless to say that the same effect can be obtained, as far as the structure has a positional relationship that the surface of the input-output terminal 22 is lower than the surface of the external connecting terminal 21, when the mounting surface is positioned facing upwardly.

Third Embodiment

Next, a third embodiment of the piezoelectric device according to the present invention will be explained, with reference to FIG. 6 to FIG. 8.

Figure 6A:
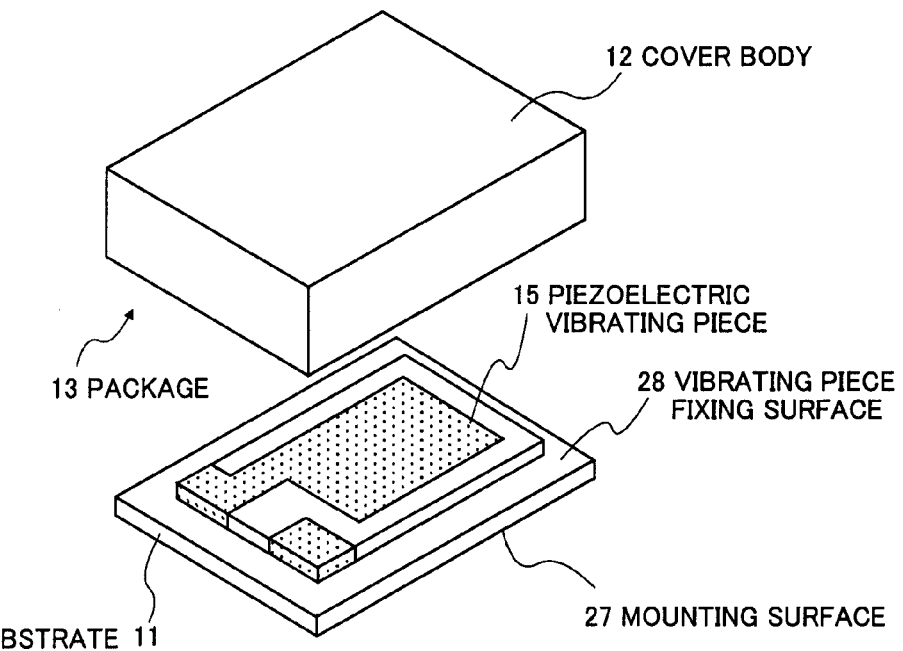
FIG. 6 illustrates perspective views of a structure of the piezoelectric device according to a third embodiment of the present invention.
Figure 6B:
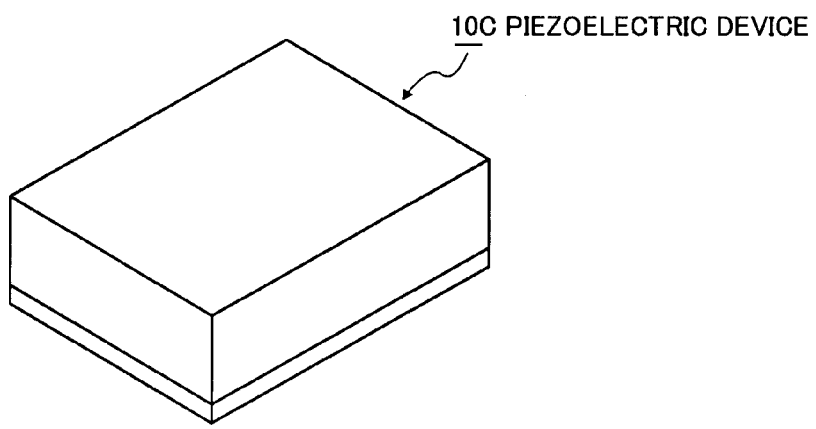
Figure 6C:
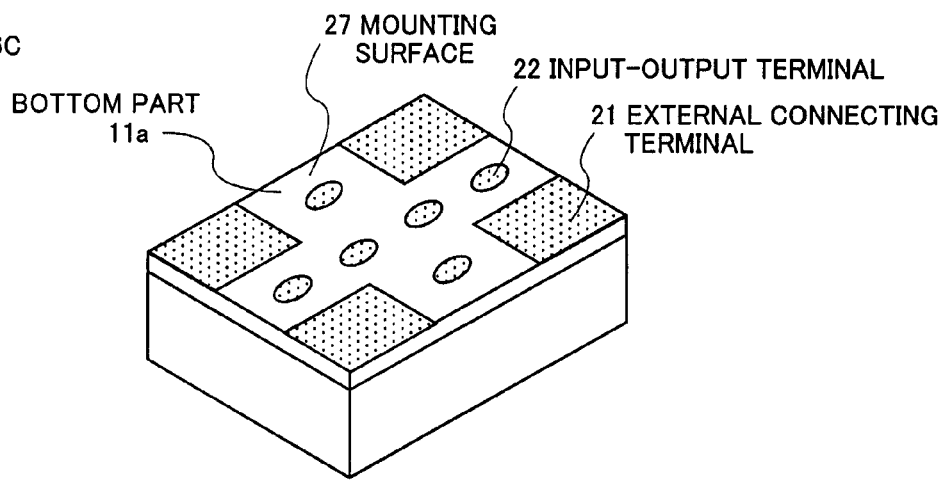

FIG. 6 illustrates perspective views of a structure of the piezoelectric device according to the third embodiment of the present invention. FIG. 6A is a perspective illustration to explain the configuration of the piezoelectric device of the present invention, FIG. 6B is a perspective illustration viewed from the top of the piezoelectric device of the present invention, and FIG. 6C is a perspective illustration viewed from the mounting surface of the piezoelectric device of the present invention. It is to be noted that FIG. 6A illustrates a partially exploded structure to explain the configuration of the piezoelectric device of the present invention, for the sake of easy understanding.

The first and second embodiments described above represent the configuration example where the piezoelectric vibrating piece and the circuit element are electrically connected, and a concave part for storing at least the piezoelectric vibrating piece is provided on the substrate. On the other hand, the third embodiment represents an example where the substrate has a plate-like shape, and the cover body has a concave shape.

It is to be noted that the piezoelectric device according to the third embodiment as shown in FIG. 6 has a structure having a plate-like substrate 11, in the package 13 of the first and the second embodiments as shown in FIG. 1 and FIG. 3, and the other configuration is approximately the same. In FIG. 6, the members which are the same as those explained in FIG. 1 and FIG. 3 are labeled the same.

In the configuration as shown in FIG. 6, the cover body 12 is formed in a concave shape, so as to form a cavity to store the piezoelectric vibrating piece 15 therein.

Therefore, as shown in the embodiments from the first to the third of the present invention, at least either one of the substrate 11 and the cover body 12 constituting the package 13 is formed in a concave shape, thereby allowing a formation of the cavity to store the piezoelectric vibrating piece 15. Alternatively, both the substrate 11 and the cover body 12 are formed in concave shape so that the cavity is formed. This configuration of the package can be applied to any type of piezoelectric device having the electrode terminal to perform input-output with the circuit element.

Figure 7A:
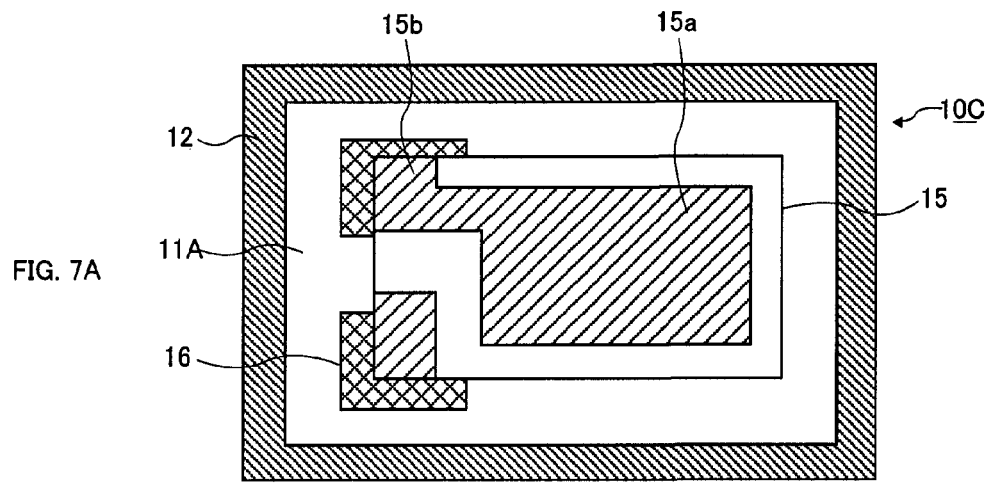
FIG. 7 illustrates a structure of the piezoelectric device according to the third embodiment of the present invention.
Figure 7B:
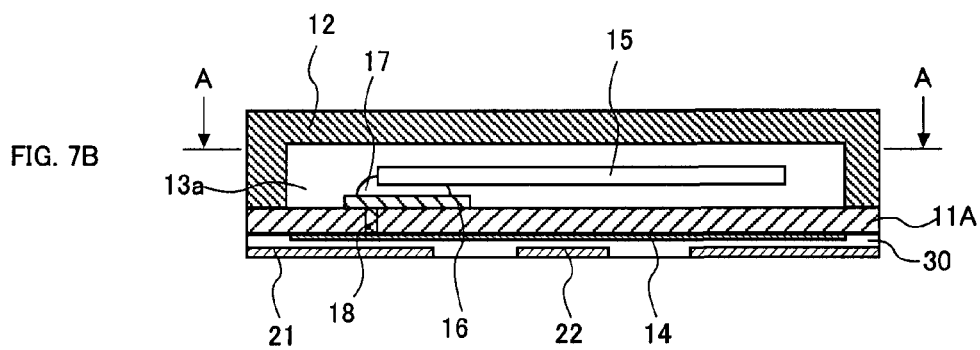
Figure 7C:
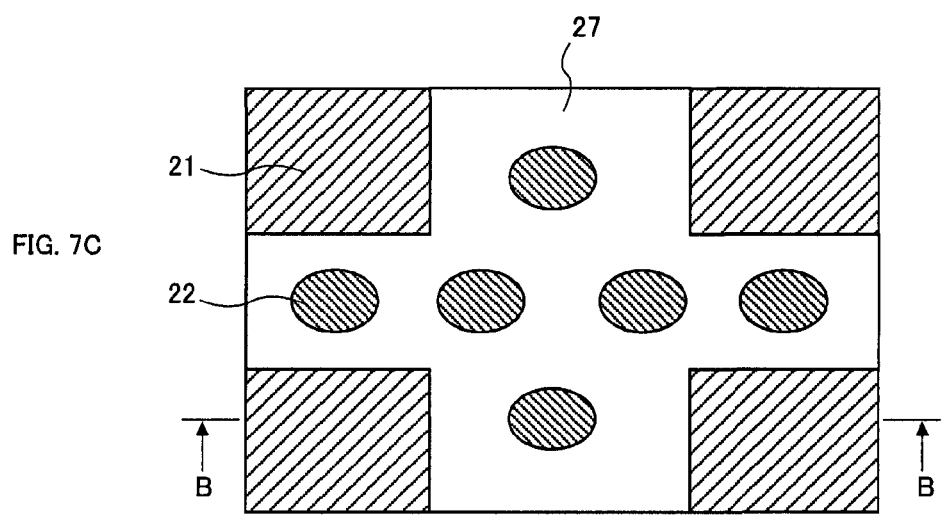

FIG. 7 illustrates a structure of the piezoelectric device according to the third embodiment of the present invention. FIG. 7A is a sectional plan view taken along line A-A of FIG. 7B, and FIG. 7B is a sectional side view taken along line B-B of FIG. 7C. FIG. 7C is a plan view of the mounting surface.

In FIG. 7, the substrate 11A is a plate-like semiconductor substrate 11A, containing silicon as a major component. On one surface of the semiconductor substrate 11A, a circuit element 14 for controlling oscillation by driving the piezoelectric vibrating piece 15 is provided, and a circuit pattern is formed. In this example here, the circuit element 14 is placed on the side of the surface to be mounted on the external circuit board, of the semiconductor substrate 11A. On the other hand, on the backside surface of the semiconductor substrate 11A, opposed to the surface where the circuit element 14 is formed, there is formed a mount electrode 16 for mounting the piezoelectric vibrating piece 15.

The circuit element 14 and the mount electrode 16 are electrically connected via a through electrode 18 that penetrates the semiconductor substrate 11A. In addition, the multilevel interconnection layer 30 is formed on the circuit pattern of the circuit element 14. The multilevel interconnection layer 30 is formed by disposing the wiring 23 within the insulating layer 29. The wiring 23 is electrically connected with the circuit pattern of the circuit element 14 via the electrode pad 24.

In addition, the external connecting terminal 21 and the input-output terminal 22 are formed in the multilevel interconnection layer 30. The external connecting terminal 21 is used for connecting the circuit element 14 with the external circuit board. Furthermore, the input-output terminal 22 is used as an input terminal for inputting control data of the piezoelectric vibrating piece 15 into the circuit element 14, or an output terminal for outputting characteristics of the piezoelectric vibrating piece 15.

In FIG. 7A and FIG. 7B, an excitation electrode 15a and a connection electrode 15b are formed on the surface of the piezoelectric vibrating piece 15 by means of evaporation or the like. The connection electrode 15b is connected electrically and mechanically with the mount electrode 16 formed on the semiconductor substrate 11A, via a conductive adhesive agent 17. In this example shown here, the piezoelectric vibrating piece 15 and the mount electrode 16 are connected via the conductive adhesive agent 17. However, a means for the bonding is not limited to this conductive adhesive agent 17, but other means may be applicable. For example, metallic bump may be employed for the connection.

After the piezoelectric vibrating piece 15 is mounted on the semiconductor substrate 11A as described above, the cover body 12 having the cavity 13a is bonded to the plate-like semiconductor substrate 11A in such a manner as covering the piezoelectric vibrating piece 15, and accordingly, the piezoelectric device 10C having the package 13 is completed.

A cover body made of metal or silicon can be used as the cover body 12. As for the bonding method, there are several bonding methods to be applied here, such as a bonding method by coating an adhesive agent on the whole circumference of the open peripheral edge of the cover body 12, a bonding method by proving Au—Sn on a bonded interface between the semiconductor substrate 11A and the cover body 12 and subjecting the Au—Sn to heated melting, and a surface activated bonding method to perform bonding by activating bonding surfaces between the semiconductor substrate 11A and the cover body 12.

FIG. 8 illustrates sectional views of the third embodiment according to the present invention, and illustrates one example of connection state between the electrode pad of the circuit element and each of the external connecting terminal and the input-output terminal. Here, there is shown an example where a circuit pattern of the circuit element is formed on the mounting surface 27 side of the semiconductor substrate 11A.

The third embodiment may be identical to the package represented by the second embodiment, except that the substrate has a plate-like shape in the package.

Figure 8A:
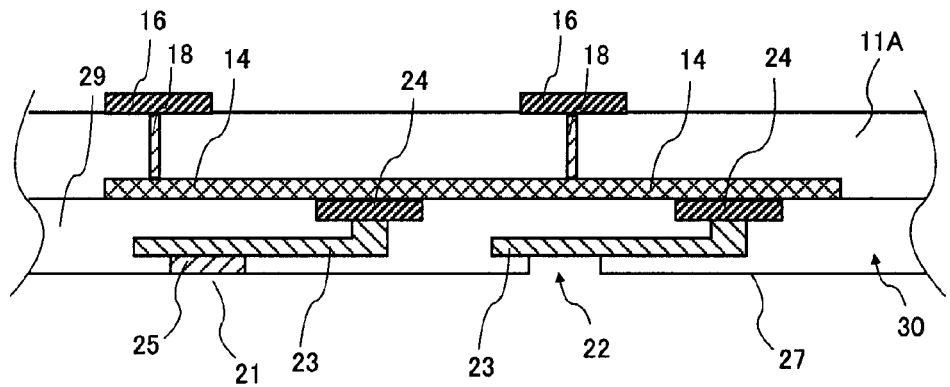
FIG. 8 illustrates sectional views of the third embodiment of the present invention.

As shown in FIG. 8A, multiple electrode pads 24 held by the circuit element 14 are connected to the wiring 23, respectively. In addition, the circuit element 14 is electrically connected to the mount electrode 16, via the through electrode 18 that penetrates the semiconductor substrate 11A.

The wiring 23 is covered by the insulating material 29 for maintaining insulation with the circuit pattern of the circuit element 14. The insulating material 29 at the parts relevant to the external connecting terminal 21 and the input-output terminal 22 are removed, and the wiring 23 at those parts are exposed, allowing the structure to be conductive with the outside.

FIG. 8A illustrates the case where the wiring 23 is formed of a material being chemically active, such as aluminum (Al). The input-output terminal 22 is formed by utilizing the part where the insulating material 29 of the wiring 23 is removed, without any change. On the other hand, the external connecting terminal 21 is formed by laminating a terminal material A (25) made of chemically stable material such as gold (Au) on the part where the insulating material 29 of the wiring 23 is removed.

The surface of the external connecting terminal 21 is made of a material chemically stable and easily wettable by solder. On the other hand, the surface of the input-output terminal 22 is chemically active, easily oxidizable, and non-wettable by solder. With this configuration, the external connecting terminal 21 is connected and fixed in such a manner as electrically and mechanically stable, when the piezoelectric device is mounted on the external circuit board, or the like. In addition, short-circuit between the external connecting terminal 21 and the input-output terminal 22 may not occur, and therefore, it is possible to provide a highly reliable piezoelectric device, which does not bring about malfunctioning, or the like.

Figure 8B:
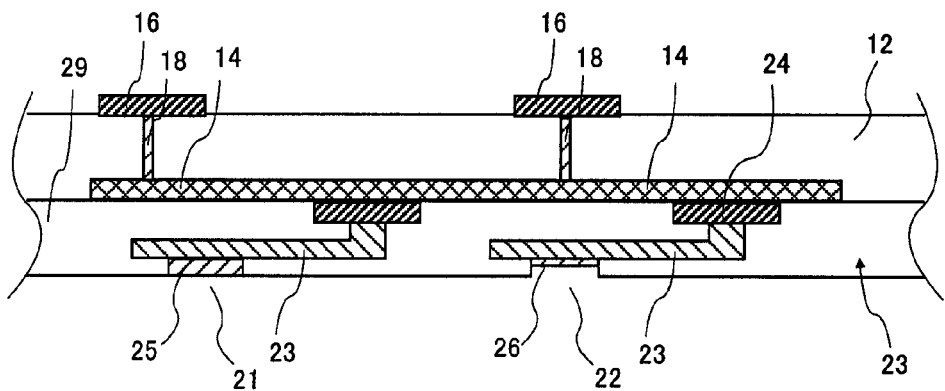
Figure 9:
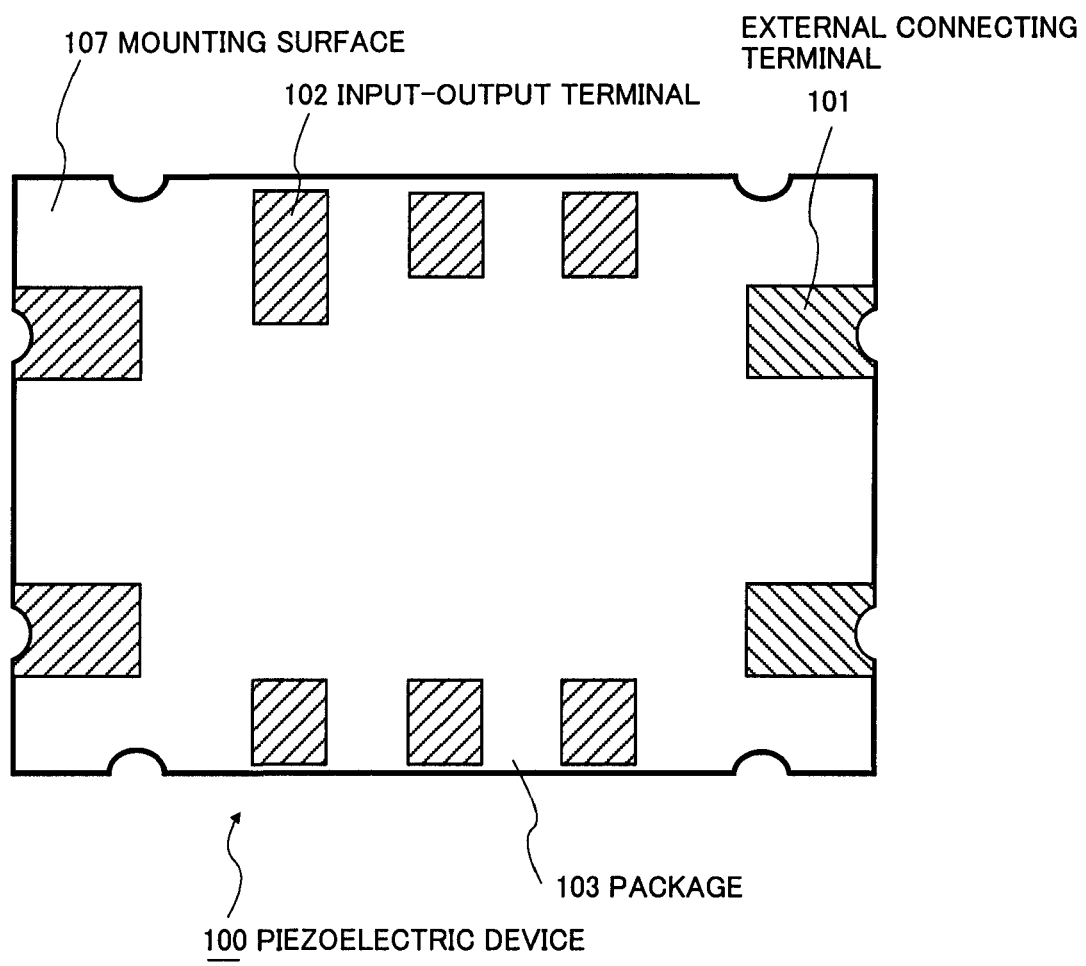
FIG. 9 illustrates a structure of a conventional piezoelectric device.

As shown in FIG. 8B, it is also possible to configure such that a terminal material B (26) that is a material being chemically active is further laminated on the part where the insulating material 29 of the wiring 23 is removed, so as to form the input-output terminal 22.

FIG. 8A illustrates the case where the wiring 23 is formed of a material being chemically active and non-wettable by solder. However, FIG. 8B illustrates a structure where the terminal material B (26) being chemically active is laminated on the part where the insulating material 29 of the wiring 23 of the input-output terminal 22 is removed, so that the input-output terminal 22 is formed. Accordingly, it is also possible to employ a material being chemically stable for the wiring 23.

It is to be noted that in the explanation of the embodiments describe above, a mounting member such as solder is coated when the piezoelectric device is mounted onto the external circuit board. However, the scope of the piezoelectric device according to the present invention includes a piezoelectric device having a structure that a mounting member such as solder is formed in advance on the external connecting terminal.

INDUSTRIAL APPLICABILITY

The present invention is applicable to a small-sized piezoelectric device.

What is claimed is:

1. A piezoelectric device comprising:
a piezoelectric vibrating piece;
a circuit element electrically connected with the piezoelectric vibrating piece;
a package including a substrate and a cover body, at least one of the substrate and the cover body having a concave shape with a space to store the piezoelectric vibrating piece inside, the other one of the substrate and the cover body having a plate like shape, and a peripheral edge of the one having the concave shape being bonded to the surface of the other one having the plate-like shape to encapsulate the piezoelectric vibrating piece therein;

an electrode terminal electrically connected to at least one of the circuit element and the piezoelectric vibrating piece, the electrode terminal having an external connecting terminal disposed on an outer surface of the package, the external connecting terminal having a surface made of at least one of gold (Au), silver (Ag), platinum (Pt), palladium (Pd), rhodium (Rd), ruthenium (Ru), iridium (Ir), osmium (Os), and copper (Cu) as a major component, the external connecting terminal being electrically connected to an external circuit board when the package is mounted on the external circuit board; and an input-output terminal having a surface made of at least one of aluminum (Al), titanium (Ti), chromium (Cr), and nickel (Ni) as a major component, the input-output terminal performing at least one of inputting control data into the circuit element and outputting characteristic data from the piezoelectric device when the package is not mounted on the external circuit board, the input-output terminal being electrically non-connected with the external circuit board when the package is mounted on the external circuit board, wherein, the surface of the external connecting terminal and the surface of the input-output terminal have respectively different adhesive properties to a mounting material mounting the package on the external circuit board, the substrate comprises a semiconductor substrate, and a circuit pattern constituting the circuit element is formed on at least one of opposing front and back surfaces of the semiconductor substrate, either one of the front and back surfaces serves as the mounting surface, when the package is mounted on the external circuit board, the circuit element is formed on one of the surfaces of the substrate, serving as the mounting surface, and the piezoelectric vibrating piece is mounted on the other surface of the substrate, the piezoelectric vibrating piece and the circuit element are electrically connected via a through electrode that penetrates in the substrate, a multilevel interconnection layer including wiring electrically connected to the circuit element is formed on the circuit element, and the external connecting terminal and the input-output terminal are connected to the circuit element via predetermined wiring in the multilevel interconnection layer.

2. The piezoelectric device according to claim 1, wherein, an insulating layer is formed on the surface, except a part, of the predetermined wiring in the multilevel interconnection layer, and the input-output terminal and the external connecting terminal are formed on exposed surfaces of the wiring not covered by the insulating layer.

3. The piezoelectric device according to claim 2, wherein, a difference of elevation is provided between a terminal surface of the input-output terminal and a terminal surface of the external connecting terminal.

4. The piezoelectric device according to claim 3, wherein, the surface of the input-output terminal is positioned closer to the circuit element than the surface of the external connecting terminal.

5. The piezoelectric device according to claim 4, wherein, the surface of the external connecting terminal is provided with solder used for mounting.

6. The piezoelectric device according to claim 3, wherein, the surface of the external connecting terminal is provided with solder used for mounting.

7. The piezoelectric device according to claim 2, wherein, the surface of the external connecting terminal is provided with solder used for mounting.

8. The piezoelectric device according to claim 1, wherein, the surface of the external connecting terminal is provided with solder used for mounting.

9. The piezoelectric device according to claim 1, wherein, the package is made of a material containing alumina as a major component.

10. A piezoelectric device comprising:
a piezoelectric vibrating piece;
a circuit element electrically connected with the piezoelectric vibrating piece;
a package including a substrate and a cover body, at least one of the substrate and the cover body having a concave shape with a space to store the piezoelectric vibrating piece inside, the other one of the substrate and the cover body having a plate like shape, and a peripheral edge of the one having the concave shape being bonded to the surface of the other one having the plate-like shape to encapsulate the piezoelectric vibrating piece therein;

an electrode terminal electrically connected to at least one of the circuit element and the piezoelectric vibrating piece, the electrode terminal having an external connecting terminal disposed on an outer surface of the package, the external connecting terminal having a surface made of at least one of gold (Au), silver (Ag), platinum (Pt), palladium (Pd), rhodium (Rd), ruthenium (Ru), iridium (Ir), osmium (Os), and copper (Cu) as a major component, the external connecting terminal being electrically connected to an external circuit board when the package is mounted on the external circuit board; and an input-output terminal having a surface made of at least one of aluminum (Al), titanium (Ti), chromium (Cr), and nickel (Ni) as a major component, the input-output terminal performing at least one of inputting control data into the circuit element and outputting characteristic data from the piezoelectric device when the package is not mounted on the external circuit board, the input-output terminal being electrically non-connected with the external circuit board when the package is mounted on the external circuit board, wherein, the surface of the external connecting terminal and the surface of the input-output terminal have a difference of elevation with respect to the surface of the package, the substrate comprises a semiconductor substrate, and a circuit pattern constituting the circuit element is formed on at least one of opposing front and back surfaces of the semiconductor substrate, either one of the front and back surfaces serves as the mounting surface, when the package is mounted on the external circuit board, the circuit element is formed on one of the surfaces of the substrate, serving as the mounting surface, and the piezoelectric vibrating piece is mounted on the other surface of the substrate, the piezoelectric vibrating piece and the circuit element are electrically connected via a through electrode that penetrates in the substrate, a multilevel interconnection layer including wiring electrically connected to the circuit element is formed on the circuit element, and the external connecting terminal and the input-output terminal are connected to the circuit element via predetermined wiring in the multilevel interconnection layer.

11. The piezoelectric device according to claim 10, wherein,
an insulating layer is formed on the surface, except a part, of the predetermined wiring in the multilevel interconnection layer, and
the input-output terminal and the external connecting terminal are formed on exposed surfaces of the wiring not covered by the insulating layer.

12. The piezoelectric device according to claim 11, wherein,
a difference of elevation is provided between a terminal surface of the input-output terminal and a terminal surface of the external connecting terminal.

13. The piezoelectric device according to claim 12, wherein,
the surface of the input-output terminal is positioned closer to the circuit element than the surface of the external connecting terminal.

14. The piezoelectric device according to claim 12, wherein,
the surface of the external connecting terminal is provided with solder used for mounting.

15. The piezoelectric device according to claim 13, wherein,
the surface of the external connecting terminal is provided with solder used for mounting.

16. The piezoelectric device according to claim 11, wherein,
the surface of the external connecting terminal is provided with solder used for mounting.

17. The piezoelectric device according to claim 10, wherein,
the surface of the external connecting terminal is provided with solder used for mounting.

18. The piezoelectric device according to claim 10, wherein,
the package is made of a material containing alumina as a major component.

* * * * *